(12) United States Patent
Smith et al.

(10) Patent No.: US 7,051,252 B2
(45) Date of Patent: May 23, 2006

(54) IBIST IDENTIFICATION LOOPBACK SCHEME

(75) Inventors: Brian L. Smith, Sunnyvale, CA (US); Jurgen Schulz, Pleasanton, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 532 days.

(21) Appl. No.: 10/077,614

(22) Filed: Feb. 15, 2002

(65) Prior Publication Data
US 2003/0159094 A1 Aug. 21, 2003

(51) Int. Cl.
*G01R 31/28* (2006.01)

(52) U.S. Cl. ............................ 714/715; 714/716

(58) Field of Classification Search ......... 340/825, 340/825.79; 370/241–253; 375/224–228; 379/1.01–33; 714/25, 712, 715–717
See application file for complete search history.

(56) References Cited

U.S. PATENT DOCUMENTS

| | | | |
|---|---|---|---|
| 4,562,436 A * | 12/1985 | Coleman et al. | 340/825 |
| 5,553,059 A * | 9/1996 | Emerson et al. | 370/248 |
| 5,969,538 A | 10/1999 | Whetsel | |
| 6,018,810 A | 1/2000 | Olarig | |
| 6,029,261 A | 2/2000 | Hartmann | |
| 6,182,246 B1 * | 1/2001 | Gregory et al. | 714/38 |
| 6,219,811 B1 | 4/2001 | Gruetzner et al. | |
| 6,247,154 B1 | 6/2001 | Bushnell et al. | |
| 6,327,685 B1 | 12/2001 | Koprowski et al. | |
| 6,351,789 B1 | 2/2002 | Green | |

* cited by examiner

*Primary Examiner*—Albert Decady
*Assistant Examiner*—John J. Tabone, Jr.
(74) *Attorney, Agent, or Firm*—Meyertons Hood Kivlin Kowert & Goetzel, P.C.; Rory D. Rankin (57) ABSTRACT

A method and mechanism for testing communication links. A transmitter contact, or transmission point, is assigned a unique identifier. During a given test, the transmitter conveys a test pattern to a receiver via a link. Following this test pattern, the transmitter transmits a bit of its unique identifier to the receiver. The receiver receives both the test pattern and the identifier bit, and determines whether the received test pattern matches an expected value. If the test pattern was correctly received by the receiver, the receiver transmits the received identifier bit back to the transmitter. However, if the received test pattern is not correct, the receiver complements the received identifier bit and transmits the complemented bit back to the transmitter. The transmitter receives the identifier bit from the receiver and determines whether it matches the identifier bit which was originally transmitted by the transmitter. If the returned identifier bit does not match what was originally transmitted, the transmitter records an error.

10 Claims, 8 Drawing Sheets

IBIST IDENTIFICATION LOOPBACK SCHEME

BACKGROUND OF THE INVENTION

1. Field of the Invention

This invention is related to the field of digital communications and, more particularly, to the test and debug of digital systems.

2. Description of the Related Art

As dependence on various electronic systems continues to increase, so too does the need for reliability. From a hardware perspective, reliability may be ascertained by testing at various levels. These levels of testing include system tests, printed circuit assembly (i.e. circuit board) tests and integrated circuit tests. Such tests seek to ensure proper fabrication and assembly of the various components of the system.

Numerous well known methods of test and debug exist for the purpose of debugging circuits and systems. One such method is boundary scan. Generally speaking, boundary scan involves accessing and stimulating a chip or subsystem via external pins to perform internal test functions on the device. Scan registers are then used to capture state from device input and output pins. Boundary scan typically involves driving a unique pattern over all wires at low speed and utilizing signature analysis to detect errors. Another method is to incorporate "built-in self test" (BIST) functionality into the design of a computer system. BIST involves moving test functionality directly onto the chip itself. With BIST functionality designed into a system, many test procedures may be accomplished at a higher speed than is otherwise possible. For example, by running tests at circuit speeds the duration of a test may be reduced. In addition BIST may enable the ability to do in-system tests, without the need for external test equipment. Other advantages of BIST may include simplifying any required external test equipment and reducing the cost and effort of generating test patterns and simulating faults.

Figure 1:
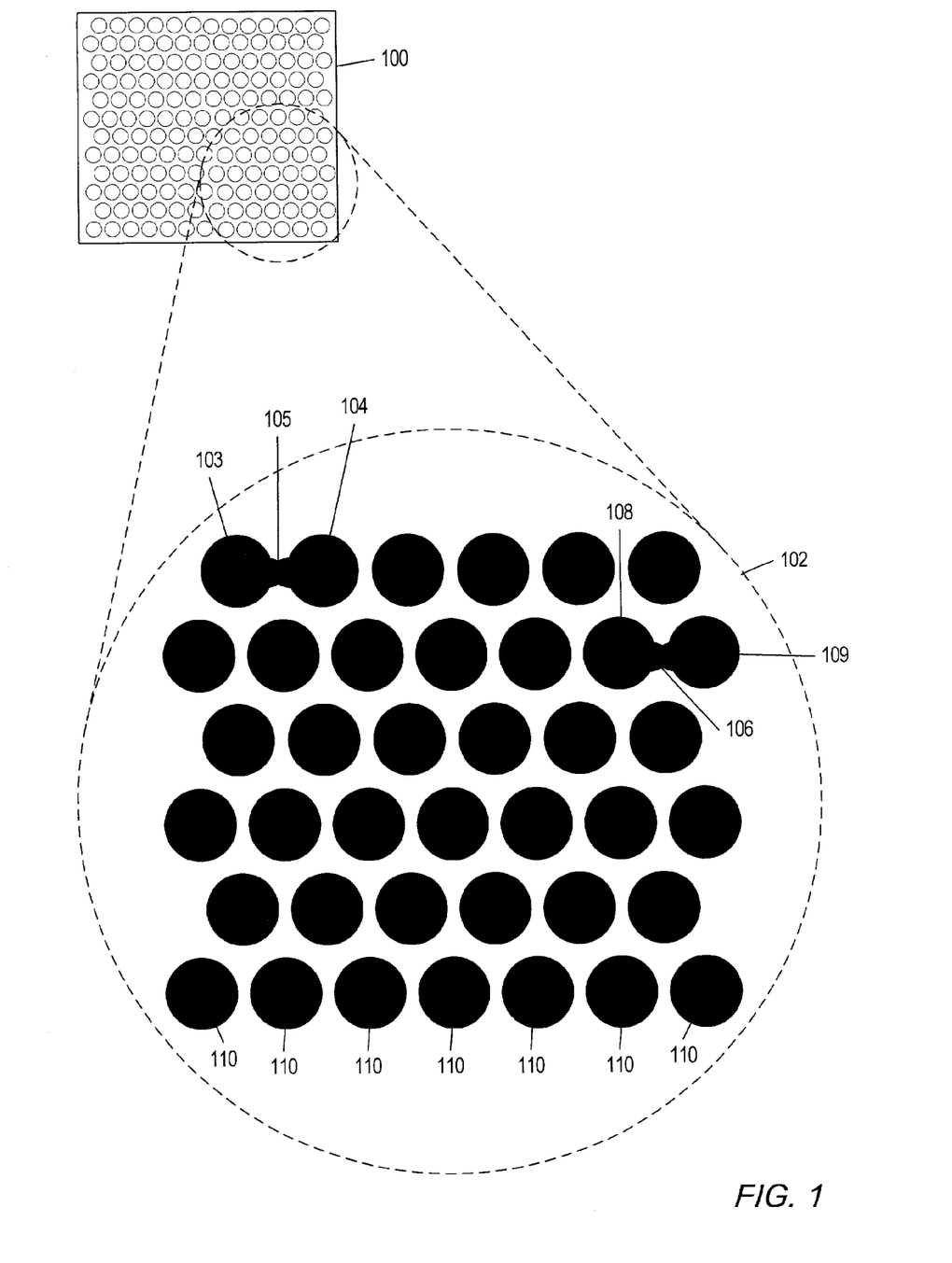
FIG. 1 illustrates bridging in a ball grid array.

As fabrication and miniaturization techniques advance, the possibility of certain defects in the fabricated part may increase. One such defect is called a bridge. FIG. 1 provides an example of a bridge fault in a fabricated part. FIG. 1 shows an integrated circuit 100 which has been fabricated and packaged using ball grid array (BGA) technology. BGA is a well known technology which enables high density, high I/O count packaging. Illustrated in FIG. 1 is an exploded view 102 of a portion of chip 100. View 102 shows an array of contact points, or balls, which are configured to transmit and/or receive signals. Generally speaking, when properly manufactured, each of the contact points should be electrically isolated from one another. For example, contact points 110 illustrate an even spacing around each point 110. However, two bridge defects 105 and 106 can be seen in view 102. A bridge 105 has been created between contact points 103 and 104. Also, a bridge 106 may be seen between contact points 108 and 109. These bridge defects results in an inability to simultaneously send and/or receive distinct signals from the bridged contact points. Consequently, errors in operation typically results.

While the illustration in FIG. 1 illustrates a bridge defect in a BGA, other manufacturing techniques may similarly result in bridge type defects. Whether BIST is used, or some other type of testing, detecting interconnect and/or bridge type defects is of great importance.

What is desired is a method and mechanism for detecting interconnect and bridge type faults.

SUMMARY OF THE INVENTION

A method and mechanism for testing communication links is contemplated. In one embodiment, each transmitter contact, or transmission point, in a system under consideration is assigned a unique identifier. During a given test, a transmitter conveys a test pattern to a receiver via a link. Following the test pattern, the transmitter transmits a bit of its unique identifier to the receiver. The receiver receives both the test pattern and the identifier bit, and determines whether the received test pattern is correct. If the test pattern was correctly received by the receiver, the receiver transmits the received identifier bit back to the transmitter. In one embodiment, the identifier bit is conveyed back to the transmitter at a relatively low speed. However, if the received test pattern is not correct, the receiver complements the received identifier bit and transmits the complemented bit back to the transmitter. The transmitter receives the identifier bit from the receiver and determines whether it matches the identifier bit which was originally transmitted to the receiver. If the returned identifier bit does not match what was originally transmitted, the transmitter records an error.

Other embodiments and details of embodiments will be described in the detailed description.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION

Figure 2A:
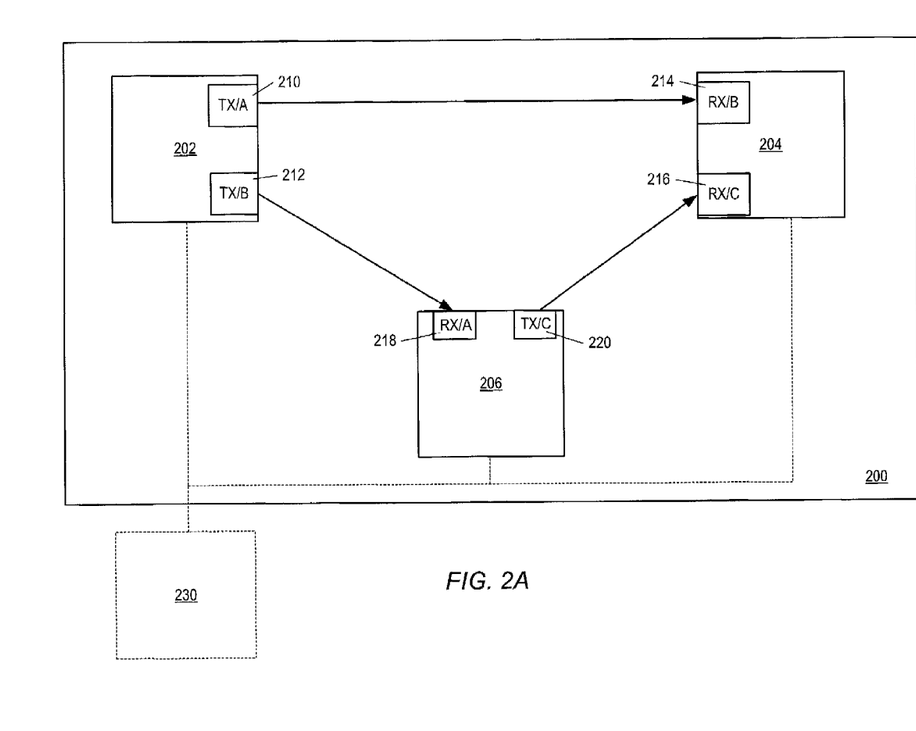
FIG. 2A illustrates one embodiment of a system.

Turning now to FIG. 2A, one embodiment of a system 200 is shown. In the embodiment of FIG. 2A, three entities 202, 204 and 206 are shown. Also shown is a service processor 230 coupled to entities 202, 204, and 206 which may be utilized in certain embodiments. In one embodiment, entities 202, 204, and 206 are separate chips placed on a circuit board 200. However, in other embodiments, each of entities 202, 204, and 206 may comprise circuitry within a single chip, chips on separate circuit boards, or otherwise.

Entity 202 includes transmitters TX/A 210 and TX/B 212. Entity 204 has a receiver RX/B 214 and a receiver RX/C 216. Entity 206 has a receiver RX/A 218 and transmitter TX/C 220. TX/A 210 is coupled to RX/B 214, TX/B is coupled to RX/A 218, and TX/C 220 is coupled to RX/C 216. In the embodiment of FIG. 2A, each of the interconnects between transmitters and receivers are unidirectional. Therefore, TX/A 210 is configured to convey data to RX/B 214, but not vice versa. As used herein, "entity" may refer to a circuit, chip, or other device configurable to transmit or receive signals.

Because a bridge defect between adjacent receivers on a board or chip may result in receivers receiving incorrect data, one method for detecting such faults involves using distinct test patterns for contact points which are adjacent to one another. For example, in the example of FIG. 2, assume receivers RX/B 214 and RX/C 216 are physically adjacent to one another. One method for testing for a bridge defect between receivers RX/B 214 and RX/C 216 involves transmitting disparate test patterns to each receiver concurrently. For example, transmitter TX/A 210 may drive a first test pattern while transmitter TX/C 220 drives a different second test pattern. During the test, transmitter TX/B 212 may be driving a third test pattern to receiver RX/A 218. Pursuant to this test, receivers RX/B 214 and RX/C 216 should receive different patterns. If it is determined that one or both of receivers RX/B 214 and RX/C 216 did not receive their expected pattern, then a bridge fault between receivers RX/B 214 and RX/C 216 may be indicated. However, while this test may provide an indication as to a possible bridge defect between receivers RX/B 214 and RX/C 216, this test may not provide an indication as to whether a bridge fault exists between transmitters TX/A 210 and TX/B 212. Consequently, simply using distinct test patterns for adjacent receivers may not provide adequate test result information.

Identification and Feedback

Figure 2B:
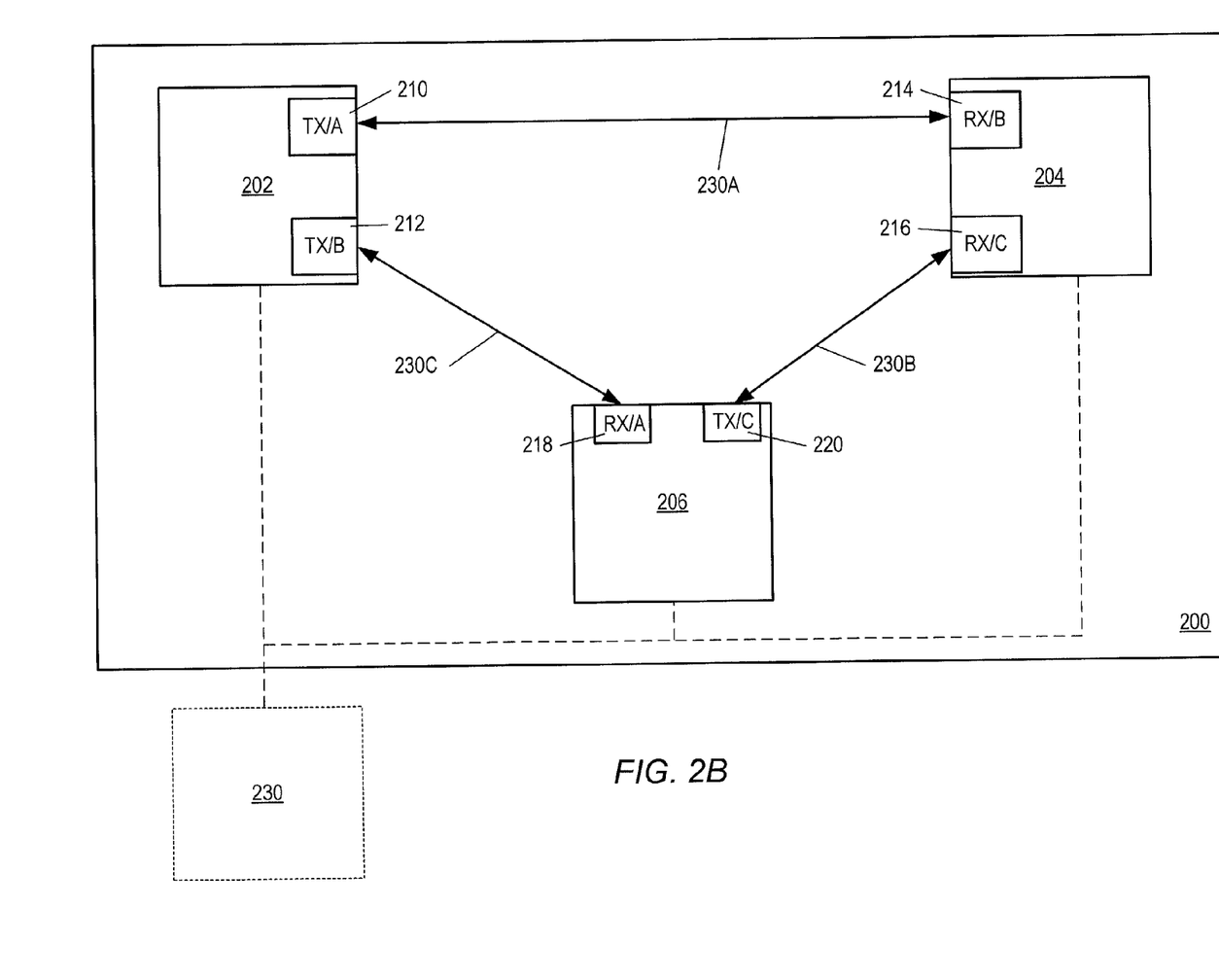
FIG. 2B illustrates one embodiment of a system.

In the following discussion, a method and mechanism for facilitating the detection of interconnect and/or bridge defects are described. FIG. 2B illustrates one embodiment of system 200 which has been configured to facilitate bridge defect testing. Generally speaking, each of the receivers RX/A 218, RX/B 214, and RX/C 216 have been configured to provide feedback 230A–230C to the transmitters to which they are coupled. Feedback which is received by a particular transmitter is expected to be distinct from feedback which is received by other transmitters. If the particular expected feedback is not received, a defect may be indicated. Further, if adjacent transmitters fail to receive expected feedback, a bridge defect between the transmitters may be indicated.

For example, each of transmitters TX/A 210, TX/B 212 and TX/C 220 may be configured to convey distinguishable test patterns. In one embodiment, adjacent transmitters may be configured to drive patterns which are the inverse of one another. In this manner, if a bridge exists between the adjacent transmitters, the pattern conveyed by one of the transmitters may interfere with the other and increase the probability the defect will be revealed. If one or both of receivers RX/B 214 and RX/C 216 detect an error (e.g., do not receive an expected pattern), a bridge defect between receivers RX/B 214 and RX/C 216 may be indicated. In response to detecting an error, each of receivers RX/B 214 and RX/C 216 may then convey an indication to transmitters TX/A 210 and TX/C 220, respectively, of the detected error. If, on the other hand, receivers RX/A 218 and RX/B 214 detect an error and receiver RX/C 216 does not detect an error, RX/A 218 and RX/B 214 convey an indication to transmitters TX/A 210 and TX/B 212, respectively, of the detected error. Because adjacent transmitters TX/A 210 and TX/B 212 both detect an error, a bridge defect between transmitters may be indicated.

Figure 3A:
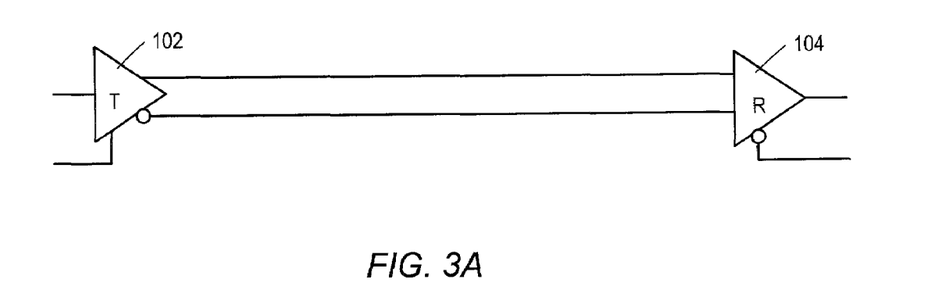
FIG. 3A illustrates one embodiment of transmitter and receiver.

FIG. 3A depicts one embodiment of a transmitter 102 and receiver 104. In one embodiment, links between transmitters and receivers are made bi-directional by utilizing receivers with transmission capability and transmitters with receiving capability. These capabilities may be added to existing transmitter and receivers, other transceiver devices may be used directly, or any suitable means of creating bi-directional capability may be used. In one embodiment, unidirectional signals may be augmented with a low speed feedback. In this manner, ordinary data transmission may be accomplished at full speed, while feedback is provided at a lower speed.

Figure 3B:
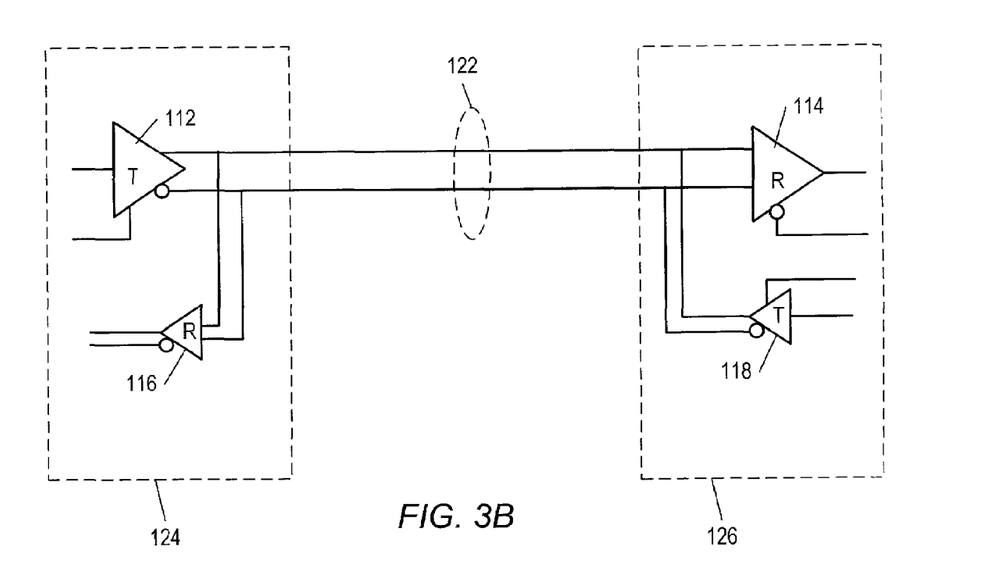
FIG. 3B illustrates one embodiment of a modified transmitter and receiver.

FIG. 3B illustrate an example of an embodiment wherein feedback capability has been added to the unidirectional system illustrated in FIG. 3A, thereby creating a bi-directional system. FIG. 3B illustrates a link 122 coupled to a first device 124 and a second device 126. Each device 124 and 126 is configured to both transmit and receive signals. In the example shown, device 124 includes transmitter 112 and receiver 116. Device 126 includes transmitter 118 and receiver 114. In one embodiment, device 124 is intended to transmit data to receiving device 126 at full operational speed. Consequently, transmitter 112 and receiver 114 may be seen as part of the normal communication path. Transmitter 118 and receiver 116 may be seen as part of a feedback path for the method and mechanism described herein. In one embodiment, feedback data conveyed from transmitter 118 to receiver 116 may be configured to operate at a lower speed than data between transmitter 112 and receiver 114. For example, transmitter 118 and receiver 116 may be weaker than transmitter 112 and receiver 114. It is noted that the method and mechanism described herein may be employed in systems utilizing a variety of signaling technologies, including differential signaling.

Figure 4A:
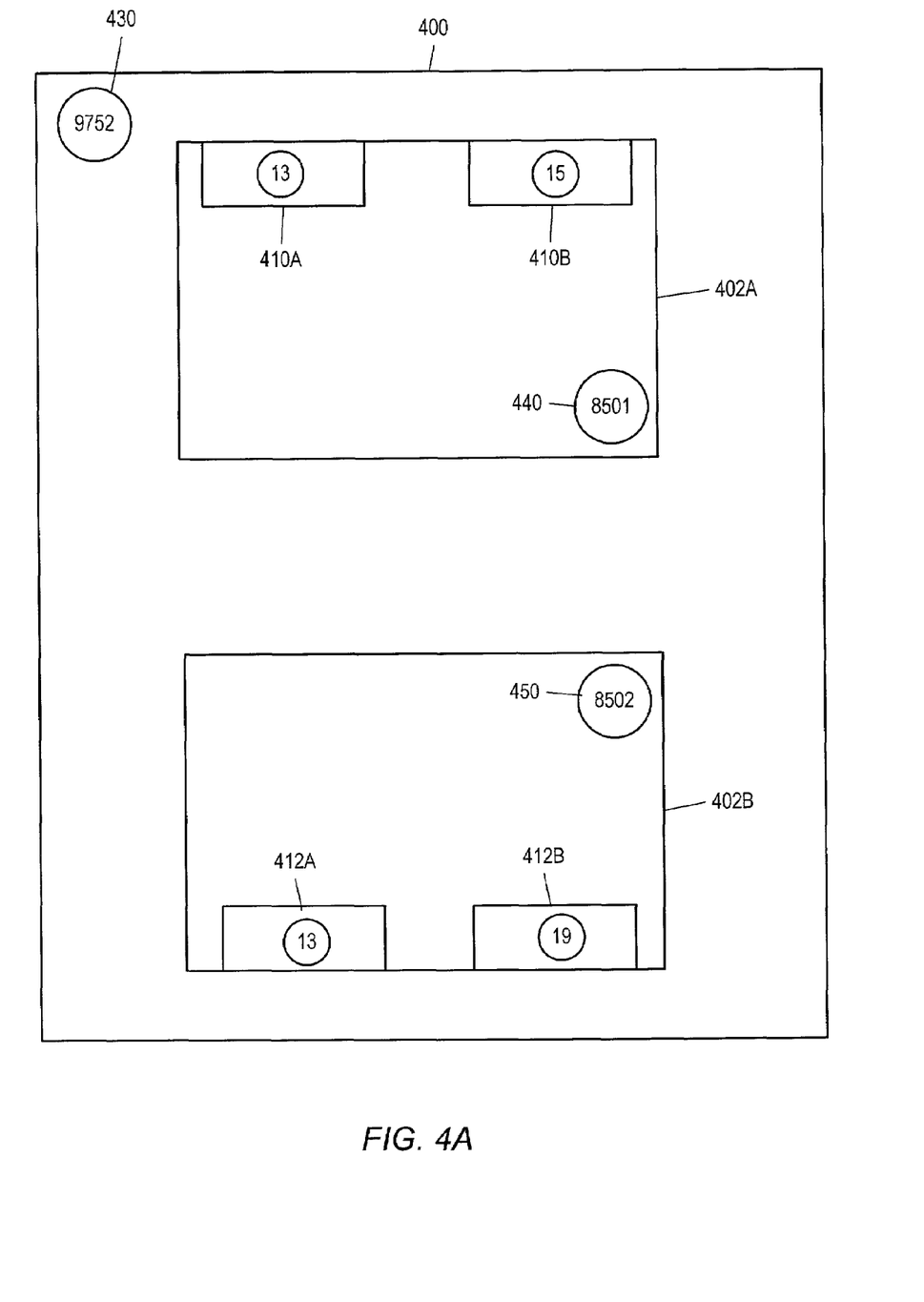
FIG. 4A illustrates a block diagram illustrating component identification.

In addition to using bi-directional links, an identification scheme is utilized for components within a system. Generally speaking, the identification scheme is configured to provide unique identifiers for transmission points, such as pins or contacts, within a region of interest. FIG. 4A illustrates an exemplary embodiment of an identification scheme. The example of FIG. 4A shows a chip 400 including two groups of circuitry 402A and 402B. Each group 402 includes two pins, or contact points. Group 402A includes contacts 410A and 410B. Group 402B includes contacts 412A and 412B. Also indicated in FIG. 4A are identifications (IDs) assigned to chip 400 and its components. An ID 430 of "9752" is assigned to chip 400, group 402A is assigned an ID 440 of "8501", and group 402B is assigned an ID 450 of "8502". Contact 410A has an ID of "13", contact 410B has an ID of "15", contact 412A has an ID of "13", and contact 412B has an ID of "19".

In one embodiment, a unique ID may be determined for each contact by concatenating IDs along a hierarchy. For example, a unique ID may be formed for contact 412A by concatenating the contact ID "13", with the ID "8502" of the group 402B to which it belongs, with the ID "9752" of the chip 400 to which that group 402B belongs. In this example, the ID formed for contact 412A would be "9752850213". As can be seen, even though both contact 410A and contact 412A have an ID of "13", the ID which is formed for each creates a unique ID. Consequently, while the ID formed for contact 412A is "9752850213", the unique ID formed for contact 410A is "9752850113".

While decimal digits are used in the IDs of the example shown in FIG. 4A, any suitable identifier which can be transmitted via a link may be used. In one embodiment, identifiers may be conveyed along a link as bits. In addition, as can be seen from FIG. 4A, the highest level identifier of the hierarchy, the chip ID "9752", is not necessarily needed to provide a unique ID for each contact. Depending on the embodiment, the number of levels necessary to create unique identifiers may vary and may be used accordingly.

Figure 4B:
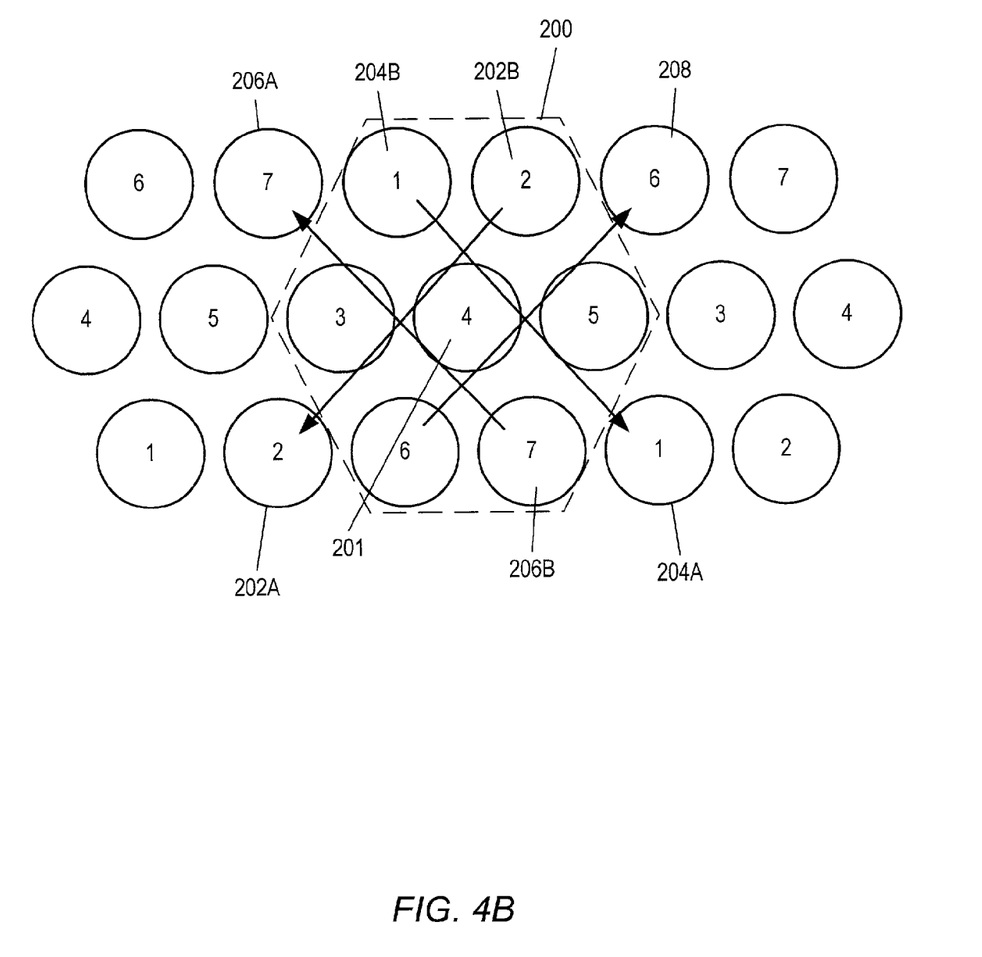
FIG. 4B illustrates a block diagram illustrating component identification.

In general, the ID scheme selected should be such that adjacent transmitters and receivers have distinguishable IDs. FIG. 4B illustrates an alternate ID assignment scheme using an array of contact points for purposes of discussion. However, other configurations, designations schemes with fewer or more designations, and other arrangements are contemplated as well. FIG. 4B shows what may, for example, be a portion of a Ball Grid Array (BGA). As can be seen in the example, a given contact point 201 in this arrangement is adjacent to six other contact points. Given such an arrangement, a minimum of seven IDs may be used to ensure no two adjacent contact points have the same ID. Therefore, included in group 200 are seven contact points which have been arbitrarily numbered from 1 to 7. From the illustration, it can be seen that the contact point numbered 4 is adjacent to six other contact points, 1–3 and 5–7.

In one embodiment, an ID scheme using only seven distinct numbers as described above is used. As already mentioned, the numbering of a given group of contact points is arbitrary. However, whatever numbering scheme is used, the scheme should be designed to ensure that no two adjacent contact points are given the same designation. In the embodiment shown, contact points within group 200 are numbered from 1–7 in any order. Contact points outside of, and adjacent to, group 200 are numbered with the same number of the contact point on the opposite side of group 200. For example, contact point 202A takes the designation of the contact point on the opposite corner of group 200, contact point 202B. Similarly, contact point 206A takes the designation of contact point 206B. Contact point 204A takes the same designation as contact point 204B. Other schemes which ensure no two contact point have the same designation are adjacent may be used as well. Such a scheme helps ensure that only extremely unlikely bridge defects, for example a bridge defect between 204A and 204B which does not involve other contact points, will be undetected. Having created unique identifiers for each contact, a test method utilizing feedback may be used.

Figure 5:
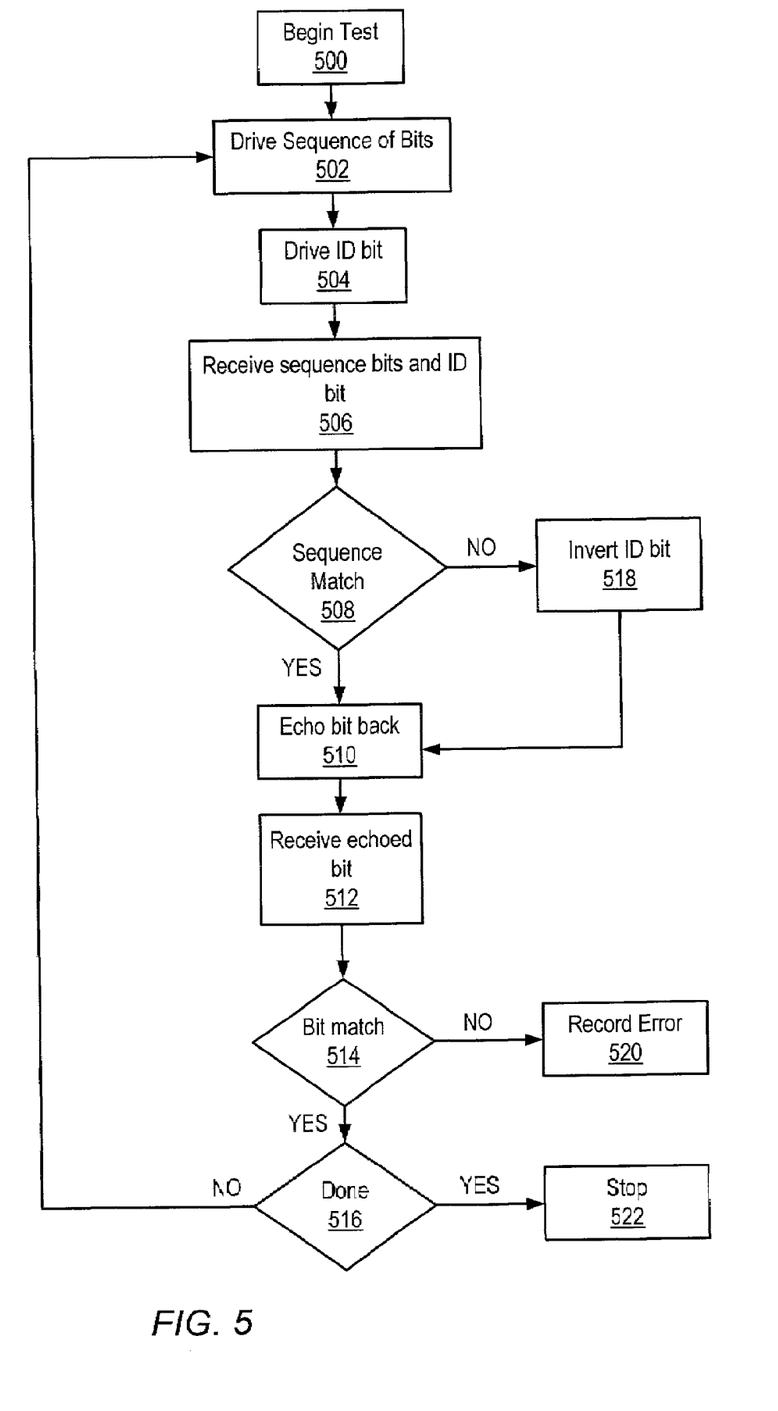
FIG. 5 illustrates one embodiment of a test method.

FIG. 5 illustrates one embodiment of a method for using feedback during testing. In general, the method contemplates interspersing bits of an ID with a test pattern. Subsequent to beginning a test (block 500), a test pattern is driven (block 502) from a transmitter to receiver. The transmitter then drives a single bit of its unique ID (block 504) to the receiver. Alternative embodiments may drive more than a single bit of the ID at a time. The receiver receives the transmitted test pattern and ID bit (block 506). If the test pattern received by the receiver matches an expected test pattern (block 508), the receiver drives back the received ID bit (block 510). If the receiver does not receive the expected test pattern, the receiver complements the received ID bit (block 518) and drives back the complemented bit. The transmitter receives the bit (block 512) which is driven back from the receiver and compares it to the bit which it originally transmitted. If the transmitter is fed back the ID bit it originally transmitted (decision block 514), testing continues. However, if the ID bit which is fed back does not match what was originally transmitted, the transmitter detects an error (block 520). In one embodiment testing may continue after recording an error. If testing is not done (decision block 516), a next test pattern may be driven (block 502) followed by the next bit of the transmitter ID (block 504).

In one embodiment, a predetermined number of clock cycles may be established for certain phases of a test. For example, a given number of test pattern bits may be driven during a given N clock cycles. Following the N clock cycles, a bit of the transmitter ID is driven. The receiver is configured to detect the test pattern during the N clock cycles and detect the ID bit on the following cycle or cycles. After the transmitter drives the test pattern and ID bit, the transmitter is configured to wait some number, M, of clock cycles. During the M clock cycles the receiver may receive the test pattern, compare the received pattern to an expected pattern, and drive either the received ID bit or its complement back. After some clock cycles P, the transmitter is configured to sample the link for the bit which is fed back from the receiver. The transmitter may then compare the returned bit to that which was originally transmitted.

Figure 6:
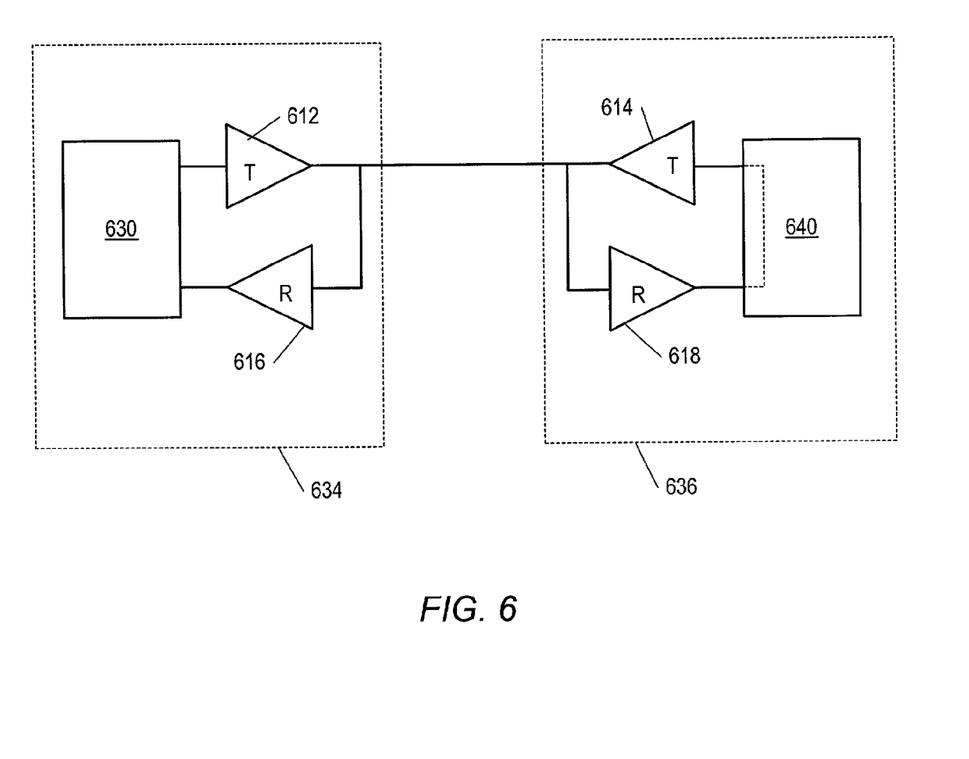
FIG. 6 illustrates one embodiment of a system.

FIGS. 6 illustrates an embodiment wherein a feedback capability is added to a bi-directional interconnect. FIG. 6 shows transceivers 634 and 636. Transceiver 634 includes transmitter 612 and receiver 616. Transceiver 636 includes transmitter 614 and receiver 618. In the embodiment shown, additional circuitry has been added to each of transceivers 634 and 636. In one embodiment, transceiver 634 is configured to drive bits of its ID to transceiver 636 as described above. Transceiver 636 includes additional circuitry 640 which is configured to "loopback" the received ID bit to transceiver 634.

In one embodiment, circuitry 640 of transceiver 636 is configured to compare received ID bits to expected values. Subsequent to receiving all the ID bits from transceiver 634, transceiver 636 returns an indication of whether the ID which it received matched the expected ID. In an alternative embodiment, circuitry 640 may be configured to feedback received ID bits as they are received. In such an embodiment, transceiver may be configured to receive an input pattern, determine that the next received bit is an ID bit, and enable a loopback mechanism for the next received bit. If a received pattern is detected to be incorrect, the loopback mechanism inverts the ID bit prior to sending it back to the transmitting device. If no errors are detected, the ID bit is not inverted. Circuitry 630 may then be configured to determine whether the ID bit which is received from transceiver 636 matches what was originally conveyed. If the ID bit does not match, transceiver 634 may record an error.

In certain instances, an ID bit may be incorrectly received by a receiving device. If the ID bit is then inverted prior to feeding it back to the transmitting device, the transmitting device may receive an ID bit matching what was originally conveyed and incorrectly assume no error was detected. In order to minimize the probability such false passes, multiple tests may be run. Also, because an ID may be several bits in length, the probability of all iterations passing is unlikely. Further, in one embodiment, a transmitting device may be configured to alternately transmit its ID in both an inverted and uninverted form. Consequently, the possibility of false passes may be further reduced.

In an alternative embodiment, full speed transceivers may be utilized wherein a full speed sending and receiving path are used. In such an embodiment, while the receiver may be configured to perform checking of the received pattern and/or ID, the receiver may simply echo back the received pattern, including the received ID bit(s). The transmitter may then check the echoed pattern against the pattern originally sent. In such an embodiment, the receiver need not include any mechanism for checking the correctness of the received pattern. Alternative embodiments may include the receiver being configured to send back less than all of the received pattern and ID bits.

While the present invention has been described with reference to particular embodiments, it will be understood that the embodiments are illustrative and that the invention scope is not so limited. For example, while the above embodiment contemplates the transmission of bits, and the complementing of ID bits, other embodiments may utilize different transmission and encoding technologies. Those skilled in the art will recognize that the method and mechanism described herein may be applied to a variety of signaling technologies and systems.

Any variations, modifications, additions, and improvements to the embodiments described are possible. These variations, modifications, additions, and improvements may fall within the scope of the inventions as detailed within the following claims.

What is claimed is:

1. A method of testing comprising:
    transmitting data via a first transmitter, wherein said data comprises:
        a first data comprising a test pattern; and
        a second data, wherein said second data comprises a first portion of an identifier of the first transmitter;
    receiving the first data and said second data at a first receiver;
    transmitting a first feedback data from said first receiver to said first transmitter, in response to determining said first data is correct, wherein said first feedback data is selected to be equal to said first portion of the identifier of the first transmitter;
    transmitting a second feedback data from said first receiver to said first transmitter, wherein said second feedback data comprises the complement of said first portion of the identifier of the first transmitter in response to determining said first data is not correct.

2. The method of claim 1, wherein said first data comprises a test pattern, said identifier comprises a sequence of bits, and wherein said first portion comprises a single bit of said sequence of bits.

3. The method of claim 1, wherein said first receiver determines said first data is correct in response to determining said received first data matches an expected data.

4. The method of claim 1, further comprising transmitting a third data from a second transmitter, wherein said second transmitter is adjacent to said first transmitter, and wherein said third data does not equal said second data.

5. The method of claim 1, wherein said first transmitter is configured to transmit said first and second data at a first speed, and wherein said first receiver is configured to convey said first and second feedback data at a second speed, wherein said second speed is lower than said first speed.

6. A system comprising:
    a first transmitter, wherein said first transmitter is configured to transmit data,
        wherein said data comprises:
            a first data comprising a test pattern; and
            a second data, wherein said second data comprises a first portion of an identifier of the first transmitter;
    a first receiver coupled to said first transmitter, wherein said first receiver is configured to:
        receive the first data and second data;
        determine whether said received first data is correct;
        transmit a first feedback data to said first transmitter, in response to determining said first data is correct, wherein said first feedback data is selected to be equal to the first portion of the identifier of the first transmitter data; and
        transmit a second feedback data to said first transmitter, wherein said second feedback data comprises the complement of said first portion of the identifier of the first transmitter in response to determining said first data is not correct.

7. The system of claim 6, wherein each of said first data and said identifier comprise a sequence of bits, and wherein said first portion comprises a single bit of said sequence of bits.

8. The system of claim 6, wherein said first receiver is configured to determine said first data is correct responsive to determining said received first data matches an expected data.

9. The system of claim 6, further comprising a second transmitter adjacent to said first transmitter, wherein said second transmitter is configured to transmit a third data, wherein said third data does not equal said first data.

10. The system of claim 6, wherein said first transmitter is configured to transmit said first and second data at a first speed, and wherein said first receiver is configured to convey said first and second feedback data at a second speed, wherein said second speed is lower than said first speed.

* * * * *